(12) United States Patent
Ifis et al.

(10) Patent No.: US 12,495,498 B2
(45) Date of Patent: Dec. 9, 2025

(54) COMPONENT CARRIER INTERCONNECTION AND MANUFACTURING METHOD

(71) Applicant: AT&S Austria Technologie & Systemtechnik Aktiengesellschaft, Leoben (AT)

(72) Inventors: Abderrazzaq Ifis, Leoben (AT); Jens Riedler, Trofaiach (AT); Eva Riegler, Bruck an der Mur (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 37 days.

(21) Appl. No.: 17/804,079

(22) Filed: May 25, 2022

(65) Prior Publication Data
US 2022/0386464 A1   Dec. 1, 2022

(30) Foreign Application Priority Data

Jun. 1, 2021   (EP) .................................... 21177178

(51) Int. Cl.
*H05K 1/14*   (2006.01)
*H05K 1/11*   (2006.01)
(Continued)

(52) U.S. Cl.
CPC .............. *H05K 1/144* (2013.01); *H05K 1/113* (2013.01); *H05K 3/1283* (2013.01); *H05K 3/185* (2013.01);
(Continued)

(58) Field of Classification Search
CPC ........ H05K 1/02; H05K 1/0204; H05K 1/112; H05K 1/113; H05K 1/144; H05K 3/0094;
(Continued)

(56) References Cited

U.S. PATENT DOCUMENTS 5,779,134 A * 7/1998 Watson ............... H01L 21/4882
228/248.1
5,981,313 A * 11/1999 Tanaka ................. H01L 21/563
257/E21.511
(Continued)

FOREIGN PATENT DOCUMENTS

EP    0723388 B1    7/2002
EP    3736852 A1    11/2020
(Continued)

OTHER PUBLICATIONS

Batev, P.; Extended European Search Report in Application No. 21177178.7, pp. 1-8; Nov. 23, 2021; European Patent Office, 80298, Munich, Germany.

*Primary Examiner* — Douglas X Rodriguez
(74) *Attorney, Agent, or Firm* — Robert A. Blaha; Smith Tempel Blaha LLC

(57) ABSTRACT

A component carrier assembly includes a first component carrier having a first electrically insulating layer structure and a via in the first electrically insulating layer structure, where the via is at least partially filled with electrically conductive material and where an upper part of the via extends beyond an outer main surface of the first component carrier; and a second component carrier having a second electrically insulating layer structure, and an electrically conductive adhesive material that is at least partially embedded in the second electrically insulating layer structure. The first component carrier and the second component carrier are interconnected and the upper part of the via at least partially penetrates into the electrically conductive adhesive material.

14 Claims, 2 Drawing Sheets

(51) Int. Cl.
*H05K 3/12* (2006.01)
*H05K 3/18* (2006.01)
*H05K 3/36* (2006.01)
*H05K 3/46* (2006.01)

(52) U.S. Cl.
CPC ........... *H05K 3/368* (2013.01); *H05K 3/4623* (2013.01); *H05K 2201/041* (2013.01); *H05K 2201/09481* (2013.01); *H05K 2201/09563* (2013.01); *H05K 2203/072* (2013.01); *H05K 2203/1131* (2013.01)

(58) Field of Classification Search
CPC ........ H05K 3/185; H05K 3/341; H05K 3/368; H05K 3/1283; H05K 3/3485; H05K 3/4007; H05K 3/4623; H05K 2201/041; H05K 2201/09481; H05K 2201/09563; H05K 2203/072; H05K 2203/1131; H01L 21/486; H01L 21/563; H01L 21/8882; H01L 23/367; H01L 23/49822; H01L 24/11; H01L 24/29; H01L 24/81; H01L 24/83
USPC ........ 361/784, 767; 174/260, 262, 263, 266; 29/932, 840, 846
See application file for complete search history.

(56) References Cited

U.S. PATENT DOCUMENTS

| | | | | |
|---|---|---|---|---|
| 6,147,311 A * | 11/2000 | Higashi | ............. | H01L 23/49827 361/779 |
| 6,187,418 B1 * | 2/2001 | Fasano | .................. | H05K 1/113 428/209 |
| 6,207,550 B1 * | 3/2001 | Hase | ..................... | H01L 21/563 257/E23.068 |
| 6,265,673 B1 * | 7/2001 | Higashida | ......... | H01L 23/49827 174/262 |
| 6,558,780 B2 | 5/2003 | Suzuki et al. | | |
| 6,638,607 B1 | 10/2003 | Curcio et al. | | |
| 6,799,369 B2 | 10/2004 | Ochi et al. | | |
| 6,855,892 B2 | 2/2005 | Komatsu et al. | | |
| 7,279,412 B2 * | 10/2007 | Mok | ....................... | H05K 3/462 29/829 |
| 8,058,558 B2 | 11/2011 | Mok et al. | | |
| 8,222,534 B2 | 7/2012 | Park et al. | | |
| 8,863,379 B2 | 10/2014 | Kumar et al. | | |
| 9,445,511 B2 | 9/2016 | Kanda | | |
| 9,545,017 B2 | 1/2017 | Hunrath et al. | | |
| 10,290,570 B2 * | 5/2019 | Arai | ..................... | H01L 21/486 |
| 2002/0084108 A1 * | 7/2002 | Amir | .................... | H05K 3/3485 174/263 |
| 2004/0200065 A1 * | 10/2004 | Tsukahara | ............... | H01L 24/11 29/877 |
| 2007/0012475 A1 * | 1/2007 | Kawaguchi | ........... | H05K 3/361 29/830 |
| 2007/0228559 A1 * | 10/2007 | Tsuruko | ............... | H05K 3/4007 257/734 |
| 2008/0115961 A1 * | 5/2008 | Mok | ...................... | H05K 3/462 174/250 |
| 2008/0211095 A1 * | 9/2008 | Nishizawa | ............. | H01L 24/29 257/746 |
| 2009/0014205 A1 | 1/2009 | Kobayashi et al. | | |
| 2009/0246474 A1 * | 10/2009 | Sakurai | .................... | H01L 24/81 427/255.6 |
| 2010/0163168 A1 * | 7/2010 | Saita | ..................... | H05K 1/0231 156/247 |
| 2010/0163172 A1 * | 7/2010 | Saita | ...................... | H05K 1/185 156/272.6 |
| 2010/0200643 A1 | 8/2010 | Taketomi et al. | | |
| 2010/0212937 A1 * | 8/2010 | Kondo | .................. | H05K 3/4617 174/254 |
| 2011/0147061 A1 * | 6/2011 | Leung | ............... | H01L 23/49822 174/262 |
| 2012/0211257 A1 * | 8/2012 | Wu | .................... | H01L 23/49811 174/110 R |
| 2013/0074332 A1 * | 3/2013 | Suzuki | ................... | H05K 1/185 29/834 |
| 2013/0126221 A1 | 5/2013 | Kanda | | |
| 2013/0314886 A1 * | 11/2013 | Kobayashi | .............. | H05K 1/112 361/767 |
| 2013/0340249 A1 * | 12/2013 | Kanda | .................. | H05K 3/4069 29/852 |
| 2014/0231126 A1 * | 8/2014 | Hunrath | ............... | H05K 3/4069 174/264 |
| 2015/0000959 A1 * | 1/2015 | Su | ......................... | H05K 3/4623 29/830 |
| 2015/0060127 A1 * | 3/2015 | Terui | ..................... | H05K 1/141 29/831 |
| 2015/0353781 A1 * | 12/2015 | Namiki | .................. | C23C 14/223 205/164 |
| 2018/0218941 A1 * | 8/2018 | Arai | ..................... | H01L 23/5226 |
| 2018/0218972 A1 * | 8/2018 | Arai | ..................... | H01L 21/486 |
| 2020/0091104 A1 * | 3/2020 | Takada | ................. | H05K 3/4647 |

FOREIGN PATENT DOCUMENTS

| | | |
|---|---|---|
| JP | 2004288989 A | 10/2004 |
| JP | 2007317823 A | 12/2007 |
| JP | 4742485 B2 | 8/2011 |
| KR | 20000025527 A | 5/2000 |
| KR | 20140092258 A | 7/2014 |
| KR | 20170011016 A | 2/2017 |
| WO | 2011136817 A1 | 11/2011 |

* cited by examiner

-Prior art-

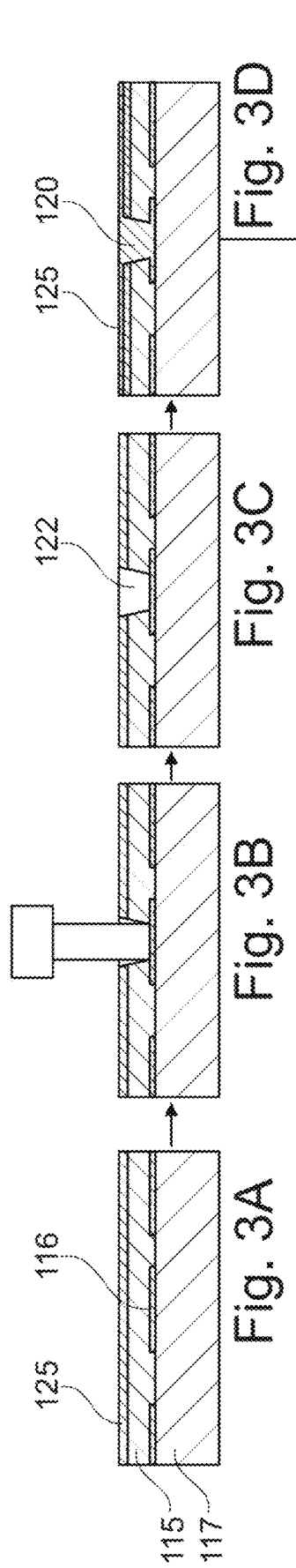
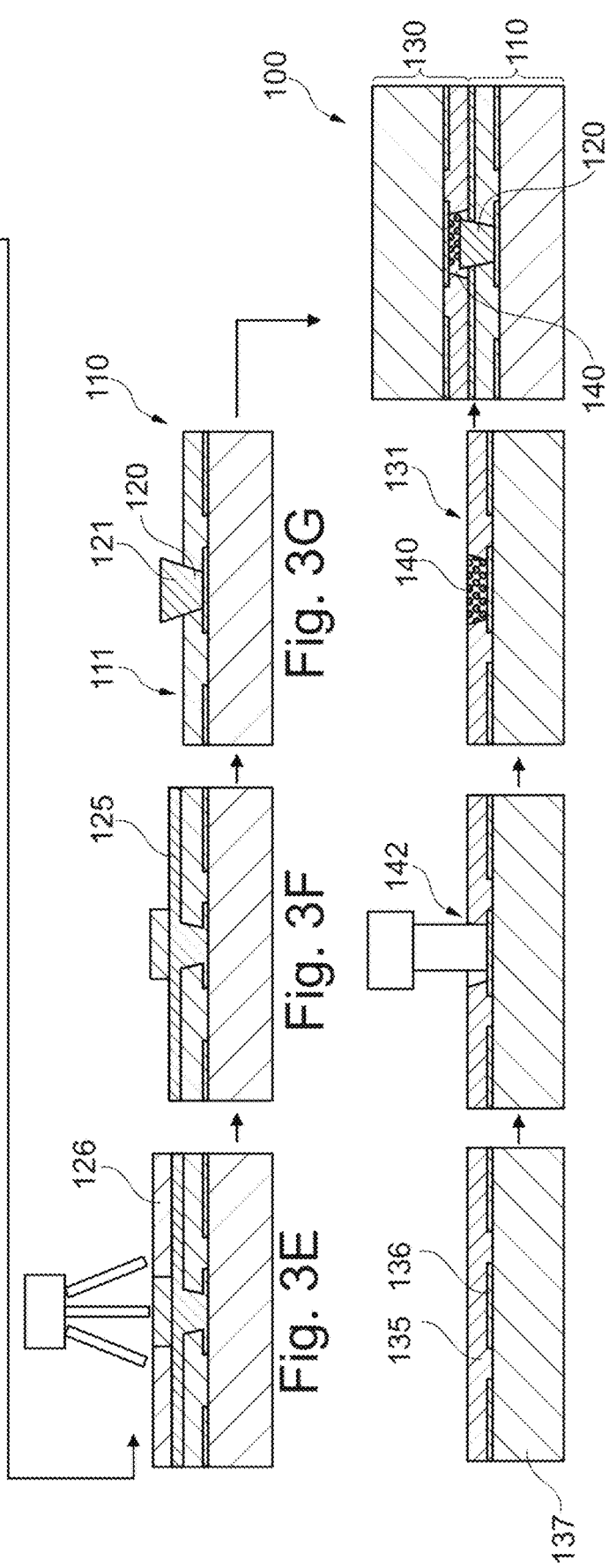

COMPONENT CARRIER INTERCONNECTION AND MANUFACTURING METHOD

CROSS-REFERENCE TO RELATED APPLICATIONS

This application claims the benefit of the filing date of European Patent Application No. 21 177 178.7, filed Jun. 1, 2021, the disclosure of which is hereby incorporated herein by reference.

TECHNICAL FIELD

Embodiments of the present invention relate to a component carrier assembly, a method of manufacturing the component carrier assembly and a use of a protruding via as an anchor structure.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically and magnetically reliable so as to be operable even under harsh conditions.

However, interconnecting two or more component carriers, in particular one above the other (in the Z-direction), may be challenging.

FIG. 2A and FIG. 2B illustrate a conventional example of an interconnection between two circuit boards 200. A first circuit board 210 and a second circuit board 230 are connected using a layer of sintering paste 240. The close-up view on the sintering paste 240 of FIG. 2B shows that the quality of copper vias through the sintering paste layer 240 may be very low. This conventional approach may thus include several drawbacks, e.g., strong limitation in structural feature sizes (and thus in miniaturization).

SUMMARY

There may be a need to provide an interconnection between at least two component carriers in an efficient, reliable, and robust manner.

In order to achieve the object defined above, a component carrier assembly, a method of manufacturing the component carrier assembly, and a use according to the independent claims are provided. The dependent claims describe advantageous embodiments.

According to an aspect of the disclosure, a component carrier assembly is described, comprising:
i) a first component carrier, having:
ia) a first electrically insulating layer structure, and
ib) a via (vertical interconnect access, e.g., a through via or a blind via) in (at least partially through) the first electrically insulating layer structure, wherein the via is (at least partially) (in particular fully) filled with electrically conductive material, and wherein an upper part (in particular an expanded upper part) (in particular comprising at least a part of the electrically conductive material) of the via extends beyond an outer main surface of the first component carrier;
ii) a second component carrier, having:
iia) a second electrically insulating layer structure, and
iib) an electrically conductive adhesive material (e.g., a sintering paste) that is (at least partially) (in particular fully) embedded in the second electrically insulating layer structure.

The first component carrier and the second component carrier are interconnected (in particular stacked (one above the other) or side-by-side) and the upper part of the via (at least partially, in particular fully) penetrates into the electrically conductive adhesive material (at an interface of the first component carrier and the second component carrier).

According to a further aspect of the disclosure, a method of manufacturing a component carrier assembly (in particular as described above) is provided. The method comprising:
i) providing a first component carrier with at least one first electrically insulating layer structure,
ii) forming a first cavity within the at least one first electrically insulating layer structure,
iii) at least partially filling the first cavity with electrically conductive material to obtain a via;
iv) forming an upper part (in particular from electrically conductive material) of the via that extends beyond an outer main surface of the first component carrier,
v) providing a second component carrier with at least one second electrically insulating layer structure,
vi) forming a second cavity in the at least one second electrically insulating layer structure,
vii) filling the second cavity at least partially with electrically conductive adhesive material,
viii) interconnecting (e.g., stacking) the first component carrier and the second component carrier, thereby
ix) penetrating the upper part of the via at least partially in the electrically conductive adhesive material.

According to a further aspect of the disclosure, there is described a use (method of using) of a copper via, that protrudes from a first component carrier, as an anchor (structure) immersed in a sintering paste of a second component carrier in order to interconnect the component carriers (in the Z-direction).

Overview of Embodiments

In the context of this document, the term "electrically conductive adhesive material" may in particular refer to any material that is electrically conductive and suitable to (at least partially) adhere two pieces (for example component carriers) together. In an example, the electrically conductive adhesive material may comprise an electrically conductive glue. In another example, the electrically conductive adhesive material may comprise an electrically conductive paste, in particular a sintering paste.

In the context of the present document, the term "via" (vertical interconnection access) may refer to an electrical connection between layers in a physical electronic circuit that goes through the plane of one or more adjacent layers. The term via may include through-hole vias, buried vias, and blind vias. Vias may be manufactured by forming a hole (e.g., laser or mechanical drilling) and at least partially filling the holes (at least partially) with electrically conductive material such as copper (e.g., by plating). In the context of this document, a (filled) via may further comprise an upper part that extends beyond the main surface of the layer structure, in which the via is formed/embedded. Said upper part may comprise electrically conductive material, in particular the same electrically conductive material as the material used for (at least partially) filling the via (in particular copper).

In the context of the present document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, a metal core substrate, an inorganic substrate and an IC (integrated circuit) substrate. A component carrier may also be a hybrid board combining different ones of the above-mentioned types of component carriers.

According to an exemplary embodiment, the disclosure may be based on the idea that an efficient, reliable, and robust interconnection between two component carriers may be achieved, when a protruding (extended) part of an electrically conductive via, that is formed (at least partially) through a first component carrier, is used as an anchor structure that penetrates into an electrically conductive adhesive material embedded in a second component carrier.

Conventionally, two circuit boards have been glued together by a continuous layer of sintering paste (see FIGS. 2A and 2B above). However, the inventors have now found that it may be surprisingly efficient and robust to apply only small portions of electrically conductive adhesive material in which protruding vias are then immersed.

The described design may provide at least some of the following advantages: design-flexible combination of different component carrier types, increasing the package density and/or complexity, increasing the layer count, reducing the amount of adhesive material, in particular expensive paste, increasing the shift compensation, enabling smaller feature sizes, allowing a further minimization of component carrier characteristics such as dielectric thickness, pad diameter, etc., and providing higher reliability performance.

According to an embodiment, the upper (protruding) part of the via (e.g., in form of a conductive trace/pad) is immersed, in particular completely immersed, into the electrically conductive and adhesive material. This may provide the advantage of an especially stable and robust interconnection. The protruding part of the via may hence function as an anchor structure that is fixed in a stable connection position.

According to a further embodiment, the outer main surface of the first component carrier and a further outer main surface of the second component carrier are directly connected. In particular, said surfaces are flush. This may provide the advantage that the component carriers are directly assembled (e.g., one above the other), in particular without a further material or layer in between.

In an example, the first electrically insulating layer structure and the second electrically insulating layer structure may be stacked (or arranged adjacent) directly one above the other with no material in between. Thereby, the only connection between the component carrier (at the interface) may be the via immersed in adhesive material or a plurality of said immersed vias.

According to a further embodiment, the electrically conductive adhesive material comprises a paste, in particular a sintering paste. Thereby, an industrially relevant and standardized material may be directly implemented. Since the sintering paste is only needed for via positions, expensive material can be saved. In an example, the sintering paste comprises an alloy and a binder. In another example, a silver paste is applied.

According to a further embodiment, the via is one of the group which consists of a blind via, a through via, a laser via, a mechanically drilled via, a completely filled via, a copper pillar, a round via, a rectangular via, a tapered via. In this manner, common component carrier via structures can be applied as component carrier interconnection vias. In an example, a via structure is chosen that may be efficiently immersed into adhesive material. A high proportion of pure copper may provide an especially positive effect on transmission properties.

According to a further embodiment, the upper part of the via comprises an electrically conductive pad/trace. In particular, the upper part is broader (expanded) than the other parts of the via.

By providing the electrically conductive pad, an electrical connection can be enabled. The pad may be formed on the embedded via in an efficient and design-flexible manner. In an example, the upper part may be expanded in comparison to the rest of the via in the x- and y-direction (in particular in case of a laser via that tapers). Using this measure, the broad upper part can form an especially robust connection with the adhesive material (mushroom-like structure).

According to a further embodiment, the first component carrier further comprises a first electrically conductive layer structure in and/or below (embedded/encapsulated) the first electrically insulating layer structure, wherein the via electrically contacts the first electrically conductive layer structure.

Additionally or alternatively, the second component carrier further comprises a second electrically conductive layer structure in and/or below the second electrically insulating layer structure, wherein the electrically conductive adhesive material electrically contacts the second electrically conductive layer structure.

This design may enable an electrical connection between the component carriers in an efficient and robust manner. For example, the first electrically conductive layer structure may be electrically connected to the via and the upper part, the electrically conductive adhesive paste, and the second electrically conductive layer structure.

According to a further embodiment, the first electrically conductive layer structure is electrically connected to the second electrically conductive layer structure through the via and the electrically conductive adhesive material.

According to a further embodiment, the first component carrier and/or the second component carrier comprises a layer stack.

Thereby, a multilayer component carrier can be efficiently provided. While it may be cumbersome to provide a multilayer component carrier stack merely by building up one and the same layer stack, it may be feasible to separately form a plurality of multilayer component carriers and then stack these one above the other.

According to a further embodiment, the first electrically insulating layer structure and/or the second electrically insulating layer structure comprises a resin layer or a prepreg layer, in particular one of the group which consists of epoxy resin, bismaleimide-triazine resin, FR-4, FR-5, cyanate ester resin, polyphenylene derivate, glass, prepreg material, polyimide, polyamide, liquid crystal polymer, epoxy-based build-up film, polytetrafluoroethylene, a ceramic, a metal oxide. This may provide the advantage that the described assembly can be manufactured by specific component carrier materials.

According to a further embodiment of the method, filling the via further comprises:

i) forming an electrically conductive layer on the outer main surface of the first electrically insulating layer, and ii) structuring the electrically conductive layer, in particular using photo-imaging and etching, to obtain the upper (protruding) part.

Thus, established component carrier manufacturing methods can be directly implemented.

According to a further embodiment of the method, stacking comprises laminating, in particular by using temperature and pressure.

According to a further embodiment of the method, the method further comprises hardening, in particular sintering, the electrically conductive adhesive material. This may provide the advantage that a robust and stable interconnection is obtained.

According to a further embodiment (of the method), the first component carrier and/or the second component carrier is applied on panel-level. This may provide the advantage that already the panels can be interconnected. At a later stage, the panels may be separated into the component carrier assemblies.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g., based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as, a metal inlay, preferably comprising copper or aluminum), a heat transfer unit (for example, a heat pipe), a light guiding element (for example, an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as, a field-programmable gate array (FPGA), programmable array logic (PAL), generic array logic (GAL) and complex programmable logic devices (CPLDs)), a signal processing component, a power management component (such as, a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example, a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Electroless Palladium Immersion Gold (ENEPIG), gold (in particular hard gold), chemical tin, nickel-gold, nickel-palladium, etc.

The aspects defined above and further aspects of the disclosure are apparent from the examples of embodiment to be described hereinafter and are explained with reference to these examples of embodiment.

BRIEF DESCRIPTION OF THE DRAWINGS

FIG. 3A, FIG. 3B, FIG. 3C, FIG. 3D, FIG. 3E, FIG. 3F, FIG. 3G, FIG. 3H, FIG. 3I, FIG. 3J and FIG. 3K illustrate a method of manufacturing a component carrier assembly according to an exemplary embodiment of the disclosure.

DETAILED DESCRIPTION OF ILLUSTRATED EMBODIMENTS

Figure 1:
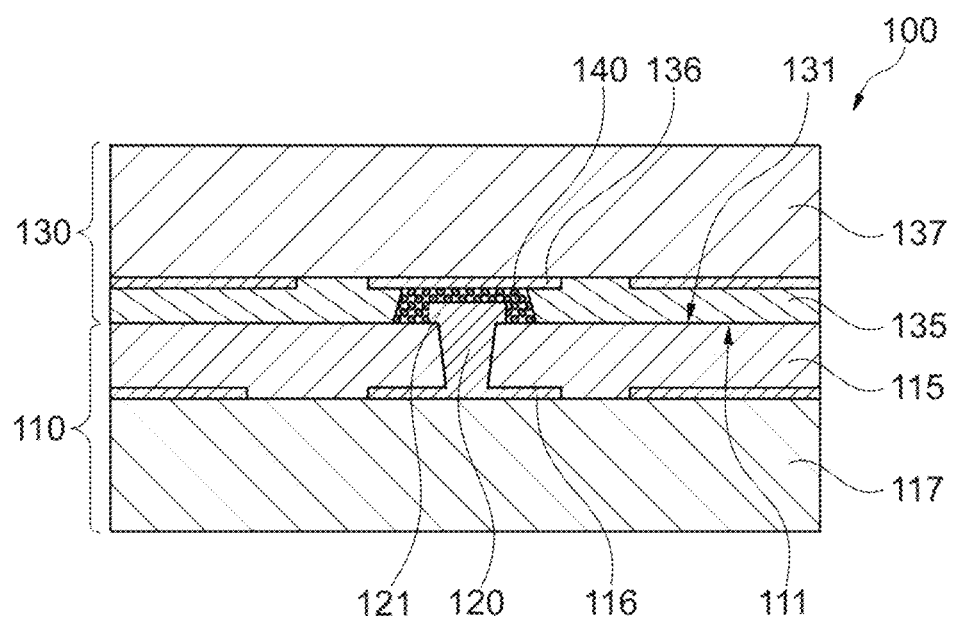
FIG. 1 illustrates a side view of a component carrier assembly according to an exemplary embodiment of the disclosure.
Figures 2A, 2B:
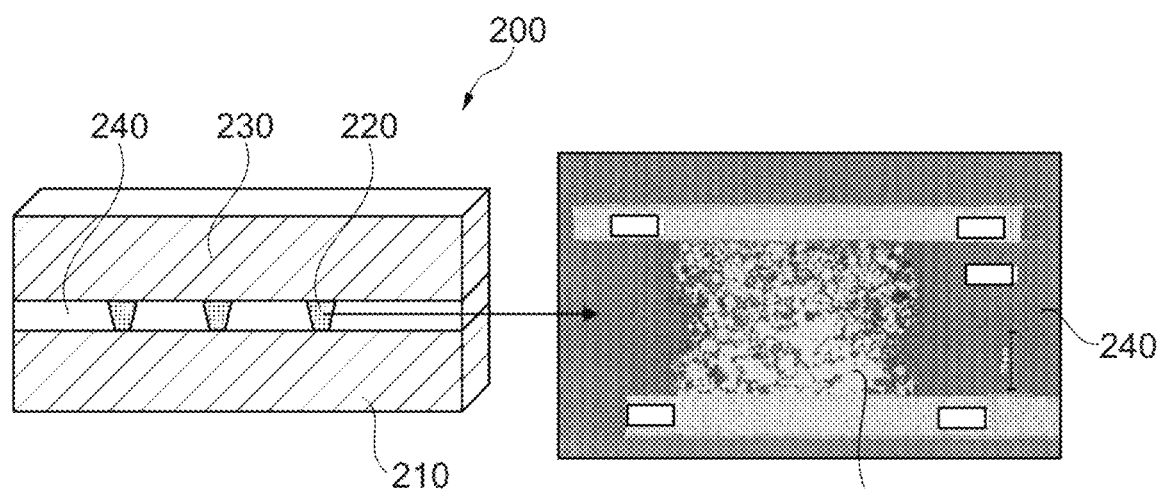
FIG. 2A and FIG. 2B illustrate a prior art example of connected circuit boards.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the disclosure have been developed.

According to an exemplary embodiment, a copper via is immersed in sintering paste to create a mushroom-like via, including for example a normal laser via capped with sintering paste. This enables greater shift compensation, reduces the need for expensive sintering paste and increases the pure copper content of the Z-axis connection. The immersion of the copper via into the paste creates a higher reliability. An electrical connection is created by sintering the paste (and melting the resin sheet). Thus, a Z-axis connection is created by a combination of a copper via and a cap based on sintering paste.

FIG. 1 illustrates a component carrier assembly 100 according to an exemplary embodiment of the disclosure.

The assembly 100 comprises a first component carrier 110, having a first electrically insulating layer structure 115, and a via 120 formed in the first electrically insulating layer structure 115. The via 120 is (completely) filled with electrically conductive material. An upper (extended) part 121 of the via 120 extends beyond an outer main surface 111 of the first component carrier 110. The first component carrier 110 further comprises a first electrically conductive layer structure 116 in (at the bottom of) the first electrically insulating layer structure 115, wherein the via 120 electrically contacts said first electrically conductive layer structure 116. The first electrically insulating layer structure 115 is arranged on a first substrate 117, e.g., a further layer stack.

The assembly 100 further comprises a second component carrier 130, having a second electrically insulating layer structure 135, and an electrically conductive adhesive material 140 that is embedded in the second electrically insulating layer structure 135. The second component carrier 130 further comprises a second electrically conductive layer structure 136 in (at the bottom of) the second electrically insulating layer structure 135, wherein the electrically conductive adhesive material 140 electrically contacts the second electrically conductive layer structure 136. The second electrically insulating layer structure 135 is arranged on a second substrate 137, e.g., a further layer stack.

The first component carrier 110 and the second component carrier 130 are stacked in the Z-direction (parallel to the Z-axis, and perpendicular to the directions of main extension (x, y) of the component carriers 110, 130) and interconnected by the upper part 121 of the via 120 that penetrates into the electrically conductive adhesive material 140 (thereby functions as an anchor). In particular, the upper part 121 of the via 120 is completely immersed into the electrically conductive and adhesive material 140. The outer main surface 111 of the first component carrier 110 and a further outer main surface 131 of the second component carrier 130 are directly connected and flush with each other.

The upper part 121 of the via 120 comprises an electrically conductive pad, wherein the upper part 121 is broader than the other parts of the via 120. The first electrically conductive layer structure 116 is electrically connected to the second electrically conductive layer structure 136 through the via 120 and the electrically conductive adhesive material 140.

FIG. 3A to FIG. 3K illustrate a method of manufacturing a component carrier assembly according to an exemplary embodiment of the disclosure.

As illustrated in FIG. 3A, a first component carrier 110 is provided with at least one first electrically insulating layer structure 115. First electrically conductive layer structures 116 are embedded at the bottom of the first electrically insulating layer structure 115 and directly on top of a first substrate 117 of the first component carrier 110. Further, an electrically conductive layer 125 is formed on the outer main surface 111 of the first electrically insulating layer 115.

In FIG. 3B and FIG. 3C a first cavity 122 is formed in the first electrically insulating layer structure 115 and through the electrically conductive layer 125 using laser drilling.

As shown in FIG. 3D, the first cavity 122 is filled with electrically conductive material to obtain a via 120 (e.g., by plating). Thereby, the thickness of the electrically conductive layer 125 is increased.

In FIG. 3E, a photo-imageable dielectric (PID) layer 126 (or other exposable resist) is applied on top of the electrically conductive layer 125. A lithographic process is carried out for forming a structure which covers the via 120 (and is then developed).

As illustrated in FIG. 3F, the electrically conductive layer 125 is structured after developing the exposable resist using subtractive etching process so that only the expanded part 121 of the via remains. The rest of the PID layer 126 is then stripped.

In FIG. 3G a first component carrier 110 with a first electrically insulating layer structure 115 and an embedded via 120 is provided, wherein the upper part 121 of the via 120 extends beyond the outer main surface 111 of the first electrically insulating layer structure 115 and of the first component carrier 110.

In FIG. 3H a second component carrier 130 with at least one second electrically insulating layer structure 135 is provided. Second electrically conductive layer structures 136 are embedded at the bottom of the second electrically insulating layer structure 135 and directly on top of a second substrate 137 of the second component carrier 130.

In FIG. 3I a second cavity 142 is formed in the at least one second electrically insulating layer structure 135 using laser drilling.

In FIG. 3J the second cavity 142 is filled with electrically conductive adhesive material 140, for example a sintering paste. The electrically conductive adhesive material 140 is embedded in the second component carrier 130 and flush with a further outer main surface 131 of the second component carrier 130.

Lastly, in FIG. 3K the first component carrier 110 and the second component carrier 130 are stacked in the Z-direction, so that the protruding upper part 121 of the via 120 penetrates into the electrically conductive adhesive material 140 and thereby forms an anchor structure. The stacking comprises laminating using temperature and pressure. The component carrier assembly 100 is now interconnected in a robust manner by hardening (in particular sintering) the electrically conductive adhesive material 140.

It should be noted that the term "comprising" does not exclude other elements or steps and the "a" or "an" does not exclude a plurality. Also, elements described in association with different embodiments may be combined.

Implementation of the disclosure is not limited to the preferred embodiments shown in the figures and described above. Instead, a multiplicity of variants is possible which variants use the solutions shown and the principle according to the disclosure even in the case of fundamentally different embodiments.

REFERENCE SIGNS

100 Component carrier assembly
110 First component carrier
111 Outer main surface
115 First electrically insulating layer structure
116 Second electrically conductive layer structure
117 First substrate
120 Via
121 Upper, extended part of via, conductive trace
122 First cavity
125 Electrically conductive layer
126 Photo-imageable dielectric layer
130 Second component carrier
131 Further outer main surface
135 Second electrically insulating layer structure
136 Second electrically conductive layer structure
137 Second substrate
140 Electrically conductive adhesive material sintering paste
142 Second cavity
200 Prior art circuit boards
210 Prior art first circuit board
230 Prior art second circuit board
240 Prior art sintering paste layer

The invention claimed is:

1. A component carrier assembly, comprising:
a first component carrier, having:
  a first electrically insulating layer structure, and
  a via in the first electrically insulating layer structure, wherein the via is at least partially filled with electrically conductive material, and wherein an upper part of the via, comprising at least a part of the electrically conductive material, extends beyond an outer main surface of the first component carrier;
a second component carrier, having:
  an electrically conductive layer structure with at least one pad;
  a second electrically insulating layer structure at the bottom of the at least one pad, wherein the at least one pad is partly covered by the second electrically insulating layer structure; and
an electrically conductive adhesive material that is at least partially embedded in the second electrically insulating layer structure;
wherein the first component carrier and the second component carrier are interconnected, in a stack; and
wherein the upper part of the via at least partially penetrates into the electrically conductive adhesive material;
wherein the electrically conductive adhesive material only surrounds the upper part of the via of the first component carrier and only partially surrounds the sidewalls of the upper part of the via,
wherein the electrically conductive adhesive material only contacts a central portion of the at least one pad.

2. The component carrier assembly according to claim 1, wherein the upper part of the via is completely immersed into the electrically conductive and adhesive material.

3. The component carrier assembly according to claim 2, wherein the outer main surface of the first component carrier and a further outer main surface of the second component carrier are directly connected, wherein the outer main surface of the first component carrier is level with the outer main surface of the outer main surface of the second component carrier.

4. The component carrier assembly according to claim 1, wherein the electrically conductive adhesive material comprises a sintering paste.

5. The component carrier assembly according to claim 1, wherein the via is one of the group which consists of a blind via, a through via, a laser via, a mechanically drilled via, a completely filled via, a copper pillar, a round via, a rectangular via, a tapered via.

6. The component carrier assembly according claim 1, wherein the upper part of the via comprises an electrically conductive pad, wherein the upper part is broader than other parts of the via.

7. The component carrier assembly according to claim 1, wherein the first component carrier further comprises:
a first electrically conductive layer structure in and/or below the first electrically insulating layer structure, wherein the via electrically contacts the first electrically conductive layer structure; and/or
wherein the second component carrier further comprises:
a second electrically conductive layer structure in and/or below the second electrically insulating layer structure, wherein the electrically conductive adhesive material electrically contacts the electrically conductive layer structure.

8. The component carrier assembly according to claim 7, wherein the first electrically conductive layer structure is electrically connected to the second electrically conductive layer structure through the via and the electrically conductive adhesive material.

9. The component carrier assembly according to claim 1, wherein the first component carrier and/or the second component carrier comprises a layer stack.

10. The component carrier assembly according to claim 1, wherein the first electrically insulating layer structure and/or the second electrically insulating layer structure comprises a resin layer or a prepreg layer, one of the group which consists of epoxy resin, bismaleimide-triazine resin, FR-4, FR-5, cyanate ester resin, polyphenylene derivate, glass, prepreg material, polyimide, polyamide, liquid crystal polymer, epoxy-based build-up film, polytetrafluoroethylene, a ceramic, a metal oxide.

11. A method of manufacturing a component carrier assembly, the method comprising:
providing a first component carrier with at least one first electrically insulating layer structure;
forming a first cavity in the at least one first electrically insulating layer structure;
at least partially filling the first cavity with electrically conductive material to obtain a via;
forming an upper part of the via comprising at least a part of the electrically conductive material that extends beyond an outer main surface of the first component carrier;
providing a second component carrier with at least one electrically conductive layer structure with at least one pad and at least one second electrically insulating layer structure at the bottom of the at least one pad, wherein the at least one pad is partly covered by the second electrically insulating layer structure;

forming a second cavity in the at least second electrically insulating layer structure;

filling the second cavity at least partially with electrically conductive adhesive material;

interconnecting by stacking the first component carrier and the second component carrier, thereby penetrating the upper part of the via at least partially in the electrically conductive adhesive material, wherein the electrically conductive adhesive material only surrounds the upper part of the via of the first component carrier and only partially surrounds the sidewalls of the upper part of the via, wherein the electrically conductive adhesive material only contacts a central portion of the at least one pad.

12. The method according to claim 11, wherein filling the via further comprises:

forming an electrically conductive layer on the outer main surface of the first electrically insulating layer; and structuring the electrically conductive layer, using photo-imaging to obtain the upper part.

13. The method according to claim 11, wherein stacking comprises laminating, by adjusting temperature and pressure.

14. The method according to claim 11, wherein the method further comprises:

hardening, by sintering, the electrically conductive adhesive material.

* * * * *